United States Patent [19]

Dean

[11] Patent Number: 4,575,826
[45] Date of Patent: Mar. 11, 1986

[54] REFRESH GENERATOR SYSTEM FOR A DYNAMIC MEMORY

[75] Inventor: Mark E. Dean, Boynton Beach, Fla.

[73] Assignee: International Business Machines Corp., Armonk, N.Y.

[21] Appl. No.: 584,032

[22] Filed: Feb. 27, 1984

[51] Int. Cl.[4] .......................... G11C 7/00; G06F 13/00
[52] U.S. Cl. ..................................... 365/222; 364/200
[58] Field of Search ......................... 365/222; 364/200

[56] References Cited

U.S. PATENT DOCUMENTS 4,332,008  5/1982  Shima et al. ..................... 364/200

Primary Examiner—Joseph A. Popek
Attorney, Agent, or Firm—Robert Lieber

[57] ABSTRACT

A refresh generator system for a dynamic memory in a data processing system, including a processor which is responsive to a hold request signal to relinquish control of the local bus and generate a hold acknowledge signal, comprises logic means to generate a hold request signal in response to an output from a refresh timer circuit. A logic circuit is responsive to a hold request, a corresponding hold acknowledge, and the timer signal to generate a refresh control signal. This signal generates a refresh signal for the memory control circuits, increments a counter circuit and initiates operation of a sequencer circuit. The sequencer then gates the output of the counter circuit to provide a memory row address and thereafter provides a memory read output to refresh the memory row defined by the address and lastly resets the circuit to terminate the hold request signal.

10 Claims, 3 Drawing Figures

REFRESH GENERATOR SYSTEM FOR A DYNAMIC MEMORY

DESCRIPTION

1. Field of the Invention

The present invention relates to a refresh generator system to provide automatic refreshing of a dynamic memory.

2. Background Art

Dynamic random access memories (DRAM's) used in most present processor systems, especially microcomputers, store data by the state of charge on capacitive cells. These cells are arranged in a matrix configuration with column and row drive lives and are individually selected by first applying a row address together with a row address strobe ($\overline{RAS}$) signal followed by a column address together with a column address strobe ($\overline{CAS}$) signal. Each time a row is addressed, either for read or write, all the cells in that row are refreshed. However a DRAM has a maximum refresh time of a few milliseconds during which all of the cells must be refreshed. In normal processing operations much of the memory may remain unaccessed for such periods. Consequently, arrangements must be made to ensure that all of the rows of the memory are accessed within the maximum refresh time.

In certain memory systems, such as the MCM 6664 memory chip manufactured by Motorola Inc., the chip includes a counter which provides successive row addresses for memory refresh. In such systems, each memory operation includes a read, a write and a refresh cycle, in the last of which the row addresses is defined by the counter value. Such systems have the disadvantage that they perform more refresh cycles than are required to refresh all of the cells within the minimum refresh time.

In the IBM Personal Computer, memory refresh is effected under the control of a programmable direct memory access (DMA) unit. This device is designed to improve system performance by allowing direct data transfer between the memory and external devices. One channel is used for memory refresh and is programed to provide successive row address counts. In response to a refresh timer output, the DMA gains control of the system by forcing a 'not read' condition to the main processor, an 8088 chip manufactured by Intel Corp., and tristating its systems bus control lines so that the DMA can apply the programmed row address to refresh a memory row. The refresh overhead in this machine, that is, the proportion of total processing time used for refresh, is approximately 7%.

SUMMARY OF THE INVENTION

The present invention arose from the requirement to refresh a DRAM in a system in which a DMA gains control of a processor by means of a Hold Request/Acknowledge handshaking sequence rather than the direct control arrangement used in the IBM Personal Computer as described above. The 80286 microprocessor, manufactured by Intel Corp., has a bus hold request input and a hold acknowledge output. The hold request input allows another device to request control of the local bus. When the microprocessor grants control, it floats its bus drivers to the tristate OFF condition and then activates the hold acknowledge output. The local bus now remains granted to the requesting device until this device de-activates the hold request signal. Using a DMA to effect memory refresh, and with the DMA operating at a cycle time of twice that of the main processor, it was discovered that the refresh overhead was increased to 12%.

Accordingly, an object of the present invention is to provide a memory refresh system with a reduced refresh overhead.

According to the present invention, a refresh generator system for a dynamic random access memory in a data processing system which includes a processor of the type which, in response to a hold request signal, relinquishes control of its local bus and generates a hold acknowledge signal, comprises first logic means responsive to a periodic signal from a refresh timer circuit to generate a hold request signal for the processor, second logic means responsive to a hold acknowledge signal from the processor to generate a refresh control signal, third logic means responsive to the refresh control signal to provide a refresh signal to control memory row access, a counter circuit coupled to be incremented by one in response to each refresh control signal, and a sequencer circuit responsive to each refresh control signal to generate a first gating signal to gate the current count in the counter circuit, representing a memory row address, to the memory and thereafter to generate a second gating signal to generate a memory read signal.

DETAILED DESCRIPTION

Figure 1:
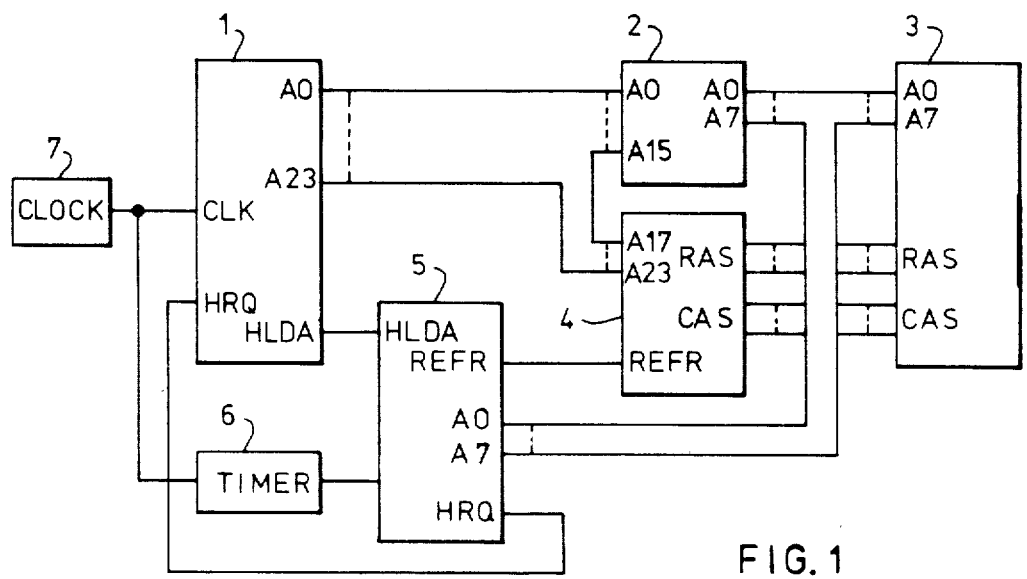
FIG. 1 is a block diagram of the memory addressing system of a microcomputer system.

Referring to FIG. 1, this is a simplified block diagram of the addressing system of a microcomputer incorporating a memory refresh system embodying the present invention. A microprocessor 1, which may be an 80286 chip produced by Intel Corp., is shown with 24 address outputs A0 through A23, a hold acknowledge output HLDA, a clock input CLK and hold request input HRQ. The remaining 41 connections to the 80286 have been omitted from FIG. 1 as they form no part of the present invention. The address outputs and clock input are self-explanatory. The HRQ and HLDA connection control ownership of the 80286 local bus. An HRQ input allows another device to request control of the local bus. When the 80286 grants control, it floats its bus drivers to an OFF condition and activates the HLDA output, thus entering a bus hold acknowledge condition. The local bus will now remain granted to the requesting device until HRQ becomes inactive, which results in the 80286 deactivating the HLDA output and regaining control of the local bus. Both HRQ and HLDA are active high signals. Address signals A0 through A16 from processor 1 are applied to an address unit 2 to address a dynamic random access memory system (DRAM) 3. The essential function of address unit 2 is to multiplex the 16 bit address inputs to provide, for each such input, two successive 8 bit outputs on its A0 through A7 output lines. The first of these outputs corresponds with the A0 through A7 inputs and is applied to the memory to provide a row address. The second corresponds with the A8 through A15 inputs to provide a column address. These addresses are interpreted by memory 3 as row and column addresses respectively in response to the successive applicant of row address strobe (RAS) and column address strobe (CAS) signals to respective inputs to the memory.

Memory 3 comprises a number of banks of $256 \times 256 \times 1$ bit chips, each having a 64K bit capacity. Each bank comprises eight such chips to store 64K bytes, with the chips in a bank connected in common to a single RAS and a single CAS input line. With, for example, four RAS inputs and two CAS inputs, up to eight such banks can be accessed in memory 3, giving a total capacity of 500K bytes.

The RAS and CAS inputs to memory 3 are selected by a memory controller 4, which includes a read-only memory device responsive to address inputs from address outputs A17 through A23 from processor 1 to select RAS and CAS outputs. In fact, this unit has other outputs used, for example, to select the system read-only control memory, but these outputs are not shown for simplicity. the other input to controller 4 is a refresh input REFR, this is used to activate all the RAS outputs simultaneously.

A memory refresh unit 5 includes address outputs A0 through A7, which are applied directly to memory unit 3, a refresh output REFR coupled to memory controller 4 and a HRQ output for processor 1. The refresh unit receives a HLDA input from processor 1 and timer inputs from a timer 6 which itself is responsive to signals from a system clock unit 7.

The specific operation of refresh unit 5 will be discussed in detail below with reference to FIG. 2. However, in brief, this unit is responsive to each output from timer 6 to develop a HRQ output. When main processor 1 accepts this output it enters its bus hold condition and passes an acknowledge signal to the HLDA input of refresh unit 5. In response to the HLDA signal, refresh unit issues a refresh output to the REFR input of memory controller to activate all the RAS lines and also provides a single row address to refresh all the memory cells in each bank of memory chips associated with that address. Refresh unit 5 then de-activates the HRQ output to allow the main processor to gain control of the system busses. For each timer input, a counter in the refresh unit is incremented by one to generate a new address count on outputs A0 through A7 such that these count outputs are incremented from 0 through 255 thereby addressing each memory row in turn for a full refresh operation.

Figure 2:
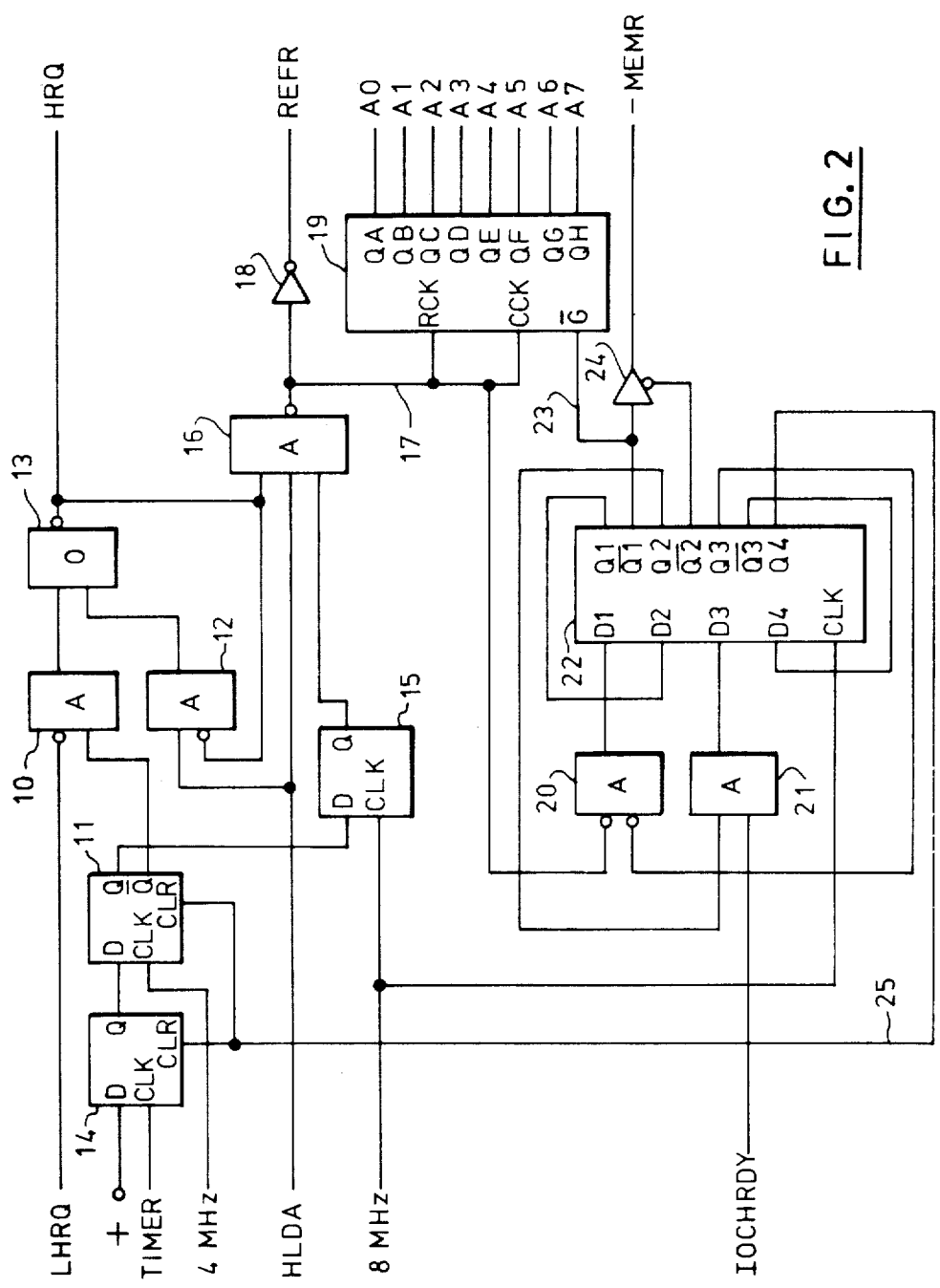
FIG. 2 is a detailed block diagram of a memory refresh system within the addressing system of FIG. 1.

FIG. 2 shows details of refresh unit 5 of FIG. 1. This unit has three clocking inputs. The first is from timer 6 (FIG. 1), which is arranged to generate a signal each $15\mu$ secs to initiate a refresh operation. The second is an 8 MHz clock from clock 7 (FIG. 1), which is the system clock, and the third is a 4 MHz clock, also derived from clock 7, which is also used to drive a programmable direct memory access controller (not shown in FIG. 1) which, as explained above is normally used to control direct data transfer between memory 3 (FIG. 1) and I/O devices (not shown) connected to the system. It is this DMA which normally generates a hold request signal (HRQ) for processor 1 to initiate a handshaking sequence, using the hold acknowledge signal (HLDA) to gain control of the bus system from processor 1. This hold request signal from the DMA, after latching, enters the FIG. 2 unit as a latched hold request input LHRQ. The LHRQ signal, which is active high, is applied as an inverted input to an AND gate 10 which, when its other input from the $\overline{Q}$ output of a flip-flop 11 is high, changes its output from high to low. This low output, in the absence of a high output from AND gate 12, provides a high HRQ signal for processor 1 from an OR gate 13. Thus, DMA hold request signals are passed directly through AND gate 10 and OR gate 13 to processor 1. There are latched by the corresponding HLDA input through AND gate 12.

Figure 3:
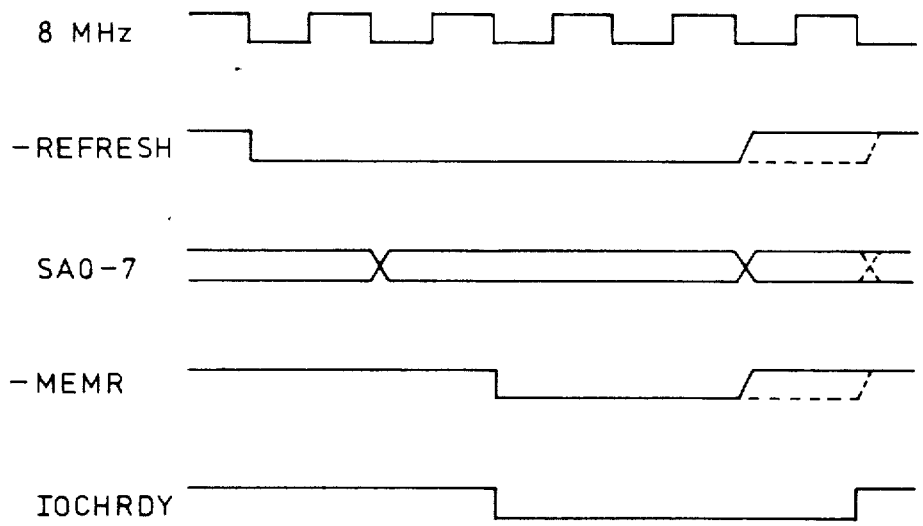
FIG. 3 is a waveform diagram illustrating input and output signals of the FIG. 3 system.

The HRQ signal is alternatively generated in response to an output from flip-flop 11. This flip-flop is driven by the Q output of a flip-flop 14. As mentioned above, the timer input provides a signal every $15\mu$ secs. This input clocks the D input, which is permanently high, to the Q output of flip-flop 14. This output is directly connected to the D input of flip-flop 11 and is transferred to the Q output of this flip-flop on the first positive-going excursion of the 4 MHz clock input. It should be noted here that this 4 MHz signal is the inverse of the 4 MHz signal driving the DMA, thus insuring that the LHRQ input from the DMA can not coincide with the clocking of flip-flop 11. When the D input is clocked to the Q output, the $\overline{Q}$ output goes low, thereby generating an active high HRQ output through AND gate 10 and OR gate 13. The Q output from flip-flop 11, now high, is applied to the D input of a flip-flop 15 which, on the next positive-going excursion of the 8 MHz system clock, raises its Q output. This output, together with the HLDA input and the HRQ signal, now all high, gate an AND gate 16, which, in response thereto, provides a low −REFRESH signal as shown in FIG. 3 on line 17. this signal is inverted by an inverter 18 to provide a high refresh signal REFR, which, as has been explained with reference to FIG. 1, causes the generation of the memory $\overline{RAS}$ signals.

The −REFRESH signal on line 17 activates two circuits, a counter/register circuit 19 and a sequencer comprising AND gates 20 and 21 and a multiple flip-flop circuit 22. Counter/register circuit 19 may be of the type SN54CS590 produced by Texas Instruments Corp. this device comprises an 8-bit binary counter feeding an 8-bit storage register. The storage register bus parallel outputs QA through QH. Separate clock inputs RCK and CCK are provided for the register and counter respectively. When these are coupled together as shown the counter state is always one ahead of the register. A gate input $\overline{G}$ (active low) gates the register to the output terminals QA through QH to provide memory address outputs A0 through A7. Thus, for each −REFRESH signal on line 17 the counter is clocked by one and for each gating signals on line 23 an address output is provided. These address outputs are sequenced to provide counts from 0 through 255 and then revert back to 0 for the next sequence. The timing of these addresses is shown on the system address SA0-7 line of FIG. 3.

Multiple flip-flop circuit 22, prior to the generation of the −REFRESH signal, provides a low output at each of terminals Q1 through Q4, and, therefore, corresponding high outputs at terminals $\overline{Q1}$ through $\overline{Q3}$. The lower input to AND gate 20, fed from the Q3 output of circuit 22 is, therefore low. The −REFRESH input through line 17 therefore gates AND gate 20 to provide a high signal to input D1 of circuit 22. On the next downward transition of the 8 MHz clock, the high D1 input is transferred to the Q1 output, making Q1 go low. This output from Q1 gates counter/register 19 to provide the current count in the register to address lines A0 through A7 to provide the system address bits SA0 through SA7 as shown in FIG. 3. As Q1 is coupled to D2 in circuit 22, on the next downward transition of the 8 MHz clock, the Q1 high output is transferred to the Q2 output, and $\overline{Q2}$ goes low. This $\overline{Q2}$ output gates a driver 24 to generate a −memory read (−MEMR) signal as shown in FIG. 3. This signal controls read cycles of the memory and replaces a normal memory read control signal from a bus controller. Thus the row, defined by the address from counter/register 19, in each of the memory blocks is accessed and thereby refreshed.

Ignoring, for the moment, the IO channel ready (IOCHRDY) input to the FIG. 2 system, the Q2 signal in circuit 22 is coupled to the D3 input, so, on the next downward transition of the 8 MHz clock, Q3 goes high and $\overline{Q3}$ goes low. The $\overline{Q3}$ output is coupled directly to the D4 input, so, on the next clock downward transition Q4 goes low. This output clears latches 14 and 11 over line 25 to drop the HRQ output. this drop disables AND gate 16, so the −REFRESH on line 17 goes high, as shown in FIG. 3. The Q3 output, when it goes high, disables gate 20, so that on the same clock cycle as above, Q1 goes low and $\overline{Q1}$ goes high. Thus the −MEMR from $\overline{Q1}$ goes back to its high state as shown in FIG. 3. Thereafter during the next two clock pulses, circuit 22 is reset to its initial state, and the FIG. 2 circuit waits for the next timer input to carry out a further refresh cycle using the incremented address in counter/register 19. Thus, in response to 256 timer input signals, the whole memory is refreshed.

The I/O channel ready (IOCHRDY) input to the FIG. 2 circuit is used if a device on a channel also includes memory which requires refreshing, but can not achieve such refreshing in the four 8 MHz clock cycles as described above. One example of such a device is a separate processor card with its own memory coupled to the FIG. 1 system through an I/O channel. This device is made responsive to the −MEMR signal to generate an IOCHRDY signal as shown in FIG. 3. As can be seen, this signal extends over a further 8 MHz cycle after the first four cycles. As shown in FIG. 2, this signal is applied to AND gate 21. Whilst IOCHRDY is in its low state, gate 21 can not pass the high signal from output Q2 to input D3. Thus this Q2 signal, which controls the return of the −REFRESH and −MEMR signals to their inactive state, is not passed to the D3 input of circuit 22 until IOCHRDY goes high. This provides a one cycle delay as shown by the dotted −REFRESH, SA0-7 and −MEMR waveforms. Accordingly, an extra clock cycle period is provided to ensure that the memory in the channel device is refreshed.

As has been mentioned above, the FIG. 2 circuit effects a refresh cycle in response to each pulse from timer 1, which pulses occur at 15μ sec. intervals. This timing is selected to ensure that each memory row is refreshed once every 4μ sec. this is a typical refresh time requirement for DRAM's. Assuming each refresh cycle takes the full 5 cycles of the 8 MHz clock due to the IOCHRDY signal, then the total refresh overhead for the FIG. 1 system is:

$$\frac{5 \times 256 \times 125.10^{-9}}{4.10^{-3}} \times 100 = 4\%$$

In other words, 4% of the total processing time of the system is devoted to memory refresh. If each refresh cycle, in the absence of IOCHRDY, takes only 4 cycles of the 8 MHz clock, then this figure reduces to 3.2%. These figures compare very favourably with that of a similar system employing DMA to effect memory refresh, in which the refresh overhead is approximately 12%.

In summary, what has been shown is a DRAM refresh system which is responsive to refresh timer inputs to develop a hold request signal to place a processor in a hold state. In response to a hold acknowledge signal from the processor, the refresh system sequences to produce signals which make a refresh cycle look exactly like a memory read cycle. These signals are a refresh signal, from which are developed read address strobe signals, a memory read signal to control the system busses, and a parallel row address byte. A counter in the refresh circuit is incremented by one during each refresh cycle so that in successive refresh cycles, successive row addresses are delivered to the memory.

While the invention has been described with reference to a preferred embodiment, it will be understood by those skilled in the art that various changes in form and detail may be made without departing from the spirit and scope of the invention as defined in the following claims.

I claim:

1. A refresh generator system for a dynamic random access memory in a data processing system which includes a processor of the type which, in response to a hold request signal, relinquishes control of its local bus and generates a hold acknowledge signal, said refresh generator system comprising first logic means responsive to a periodic signal from a refresh timer circuit to generate a hold request signal for the processor, second logic means responsive to a hold acknowledge signal from the processor to generate a refresh control signal, third logic means responsive to the refresh control signal to provide a refresh signal to control memory row access, a counter circuit coupled to be incremented by one in response to each refresh control signal, and a sequencer circuit responsive to each refresh control signal to generate a first gating signal to gate the current count in the counter circuit, representing a memory row address, to the memory and thereafter to generate a second gating signal to generate a memory read signal.

2. A refresh generator system according to claim 1 in which said first logic means includes flip-flop means responsive to said periodic signal to provide said hold request signal until reset.

3. A refresh generator system according to claim 1 in which said second logic means comprises an AND gate coupled to receive the hold request signal, the hold acknowledge signal from the processor and a further signal derived from the periodic signal to generate said refresh control signal.

4. A refresh generator system according to claim 1 in which the counter circuit includes a counter incremented by the refresh control signal and having its output coupled to a register circuit responsive to said first gating signal to gate out its content.

5. A refresh generator system according to claim 1 in which said sequencer circuit comprises a sequence of flip-flop circuits, with an output of each, except the last, coupled to the input of the following flip-flop.

6. A refresh generator system according to claim 5 in which the true output of the first flip-flop in the sequence is coupled to the input of the second flip-flop in the sequence, and the complement output of the first flip-flop provides said first gating signal.

7. A refresh generator system according to claim 6 in which the true output of the second flip-flop is coupled to the input of the third flip-flop in the sequence, and the complement output of the second flip-flop provides said second gating signal.

8. A refresh generator system according to claim 7 in which the complement output of the third flip-flop is coupled to the input of the fourth flip-flop in the sequence and the true output of the third flip flop is applied to an AND gate, which couples said refresh control signal to the input of the first flip-flop, to disable this AND gate when high.

9. A refresh generator system according to claim 8 in which the true output of the fourth flip-flop is coupled to clear the hold request signal when high.

10. A refresh generator system according to claim 1 in which said first logic means is responsive either to said periodic signal or to a request signal from a dynamic memory access unit to develop said hold request signal.

* * * * *

UNITED STATES PATENT AND TRADEMARK OFFICE
CERTIFICATE OF CORRECTION

PATENT NO. : B1 4,575,826

DATED : February 6, 1990

INVENTOR(S) : Mark E. Dean

It is certified that error appears in the above-identified patent and that said Letters Patent is hereby corrected as shown below:

The title page showing the illustrative figure should be deleted to appear as per the attached title page.

Column 2, line 63, after [Q1] delete "Q1" and insert --$\overline{Q1}$--.

Column 2, line 64, after [Q1] delete "Q1" and insert --$\overline{Q1}$--.

Signed and Sealed this

Tenth Day of March, 1992

Attest:

HARRY F. MANBECK, JR.

*Attesting Officer*   *Commissioner of Patents and Trademarks*

REEXAMINATION CERTIFICATE (1204th)
United States Patent
Dean

B1 4,575,826
Certificate Issued Feb. 6, 1990

[54] REFRESH GENERATOR SYSTEM FOR A DYNAMIC MEMORY

[75] Inventor: Mark E. Dean, Boynton Beach, Fla.

[73] Assignee: IBM Corp., Armonk, N.Y.

Reexamination Request:
No. 90/001,810, Jul. 17, 1989

Reexamination Certificate for:
Patent No.: 4,575,826
Issued: Mar. 11, 1986
Appl. No.: 584,032
Filed: Feb. 27, 1984

[51] Int. Cl.⁴ .................. G11C 7/00; G06F 13/00
[52] U.S. Cl. ............................ 365/222; 364/200
[58] Field of Search ..................... 365/222; 364/200

[56] References Cited

U.S. PATENT DOCUMENTS

| | | | |
|---|---|---|---|
| 4,158,883 | 6/1979 | Kadono et al. | 364/200 |
| 4,185,323 | 1/1980 | Johnson et al. | 365/222 |
| 4,328,566 | 5/1982 | Thaler | 365/222 |
| 4,332,008 | 5/1982 | Shima et al. | 364/200 |
| 4,344,157 | 8/1982 | White, Jr. et al. | 365/222 |
| 4,376,988 | 3/1983 | Ludwig et al. | 365/222 |
| 4,390,972 | 6/1983 | Machida | 365/222 |
| 4,556,952 | 12/1985 | Brewer et al. | 364/900 |

FOREIGN PATENT DOCUMENTS

0071743 2/1983 European Pat. Off.
55-139691 10/1980 Japan.

OTHER PUBLICATIONS

G. Feilland and K. Oishi, "Keep the Memory Interface Simple", Electronic Design, Apr. 26, 1978, pp. 84–92.
Intel 8237/8237-2 High Performance DMA Controller (publication date not available).
IBM Personal Computer Technical Reference System Manual, pp. 1–6, 1–7 and 1–37 through 1–46 (publication date not available).
R. Sartore, "Byte-Wide Dynamic RAMS Bring Speed and Simplicity to Small-Computer Systems," Electronic Design, vol. 31, No. 21, Oct. 1983, pp. 203–208.

*Primary Examiner*—Joseph A. Popek

[57] ABSTRACT

A refresh generator system for a dynamic memory in a data processing system, including a processor which is responsive to a hold request signal to relinquish control of the local bus and generate a hold acknowledge signal, comprises logic means to generate a hold request signal in response to an output from a refresh timer circuit. A logic circuit is reponsive to a hold request, a corresponding hold acknowledge, and the timer signal to generate a refresh control signal. This signal generates a refresh signal for the memory control circuits, increments a counter circuit and initiates operation of a sequencer circuit. The sequencer then gates the output of the counter circuit to provide a memory row address and thereafter provides a memory read output to refresh the memory row defined by the address and lastly rests the circuit to terminate the hold request signal.

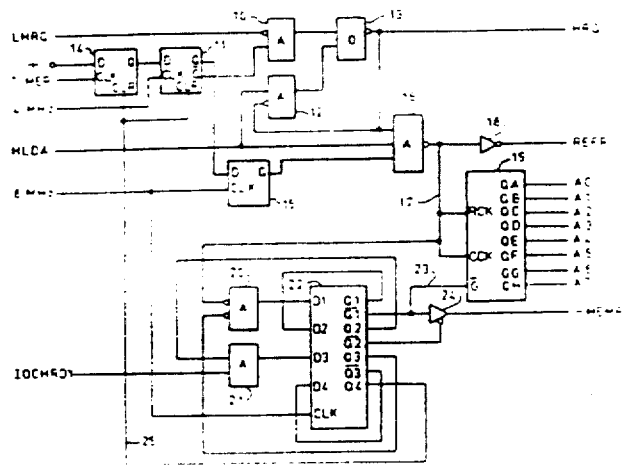

REEXAMINATION CERTIFICATE (1204th)
United States Patent [19]
Dean

[11] B1 4,575,826
[45] Certificate Issued Feb. 6, 1990

[54] REFRESH GENERATOR SYSTEM FOR A DYNAMIC MEMORY

[75] Inventor: Mark E. Dean, Boynton Beach, Fla.

[73] Assignee: IBM Corp., Armonk, N.Y.

Reexamination Request:
No. 90/001,810, Jul. 17, 1989

Reexamination Certificate for:
Patent No.: 4,575,826
Issued: Mar. 11, 1986
Appl. No.: 584,032
Filed: Feb. 27, 1984

[51] Int. Cl.⁴ .................. G11C 7/00; G06F 13/00
[52] U.S. Cl. ..................................... 365/222; 364/200
[58] Field of Search ................... 365/222; 364/200

[56] References Cited
U.S. PATENT DOCUMENTS

| | | | |
|---|---|---|---|
| 4,158,883 | 6/1979 | Kadono et al. | 364/200 |
| 4,185,323 | 1/1980 | Johnson et al. | 365/222 |
| 4,328,566 | 5/1982 | Thaler | 365/222 |
| 4,332,008 | 5/1982 | Shima et al. | 364/200 |
| 4,344,157 | 8/1982 | White, Jr. et al. | 365/222 |
| 4,376,988 | 3/1983 | Ludwig et al. | 365/222 |
| 4,390,972 | 6/1983 | Machida | 365/222 |
| 4,556,952 | 12/1985 | Brewer et al. | 364/900 |

FOREIGN PATENT DOCUMENTS

0071743 2/1983 European Pat. Off. .

55-139691 10/1980 Japan .

OTHER PUBLICATIONS

G. Feilland and K. Oishi, "Keep the Memory Interface Simple", Electronic Design, Apr. 26, 1978, pp. 84–92.
Intel 8237/8237-2 High Performance DMA Controller (publication date not available).
IBM Personal Computer Technical Reference System Manual, pp. 1–6, 1–7 and 1–37 through 1–46 (publication date not available).
R. Sartore, "Byte-Wide Dynamic RAMS Bring Speed and Simplicity to Small-Computer Systems," Electronic Design, vol. 31, No. 21, Oct. 1983, pp. 203–208.

Primary Examiner—Joseph A. Popek

[57] ABSTRACT

A refresh generator system for a dynamic memory in a data processing system, including a processor which is responsive to a hold request signal to relinquish control of the local bus and generate a hold acknowledge signal, comprises logic means to generate a hold request signal in response to an output from a refresh timer circuit. A logic circuit is reponsive to a hold request, a corresponding hold acknowledge, and the timer signal to generate a refresh control signal. This signal generates a refresh signal for the memory control circuits, increments a counter circuit and initiates operation of a sequencer circuit. The sequencer then gates the output of the counter circuit to provide a memory row address and thereafter provides a memory read output to refresh the memory row defined by the address and lastly rests the circuit to terminate the hold request signal.

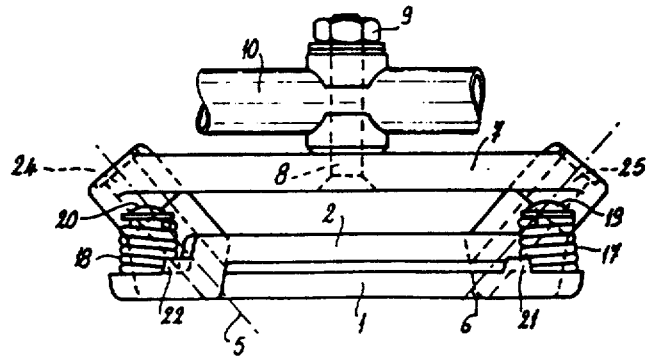

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 1, lines 34 to 48:

In the IBM Personal Computer, memory refresh is effected under the control of a programmable direct memory access (DMA) unit. This device is designed to improve system performance by allowing direct data transfer between the memory and external devices. One channel is used for memory refresh and is [programed] *programmed* to provide successive row address counts. In response to a refresh timer output, the DMA gains control of the system by forcing a ['not read'] *'not ready'* condition to the main processor, an 8088 chip manufactured by Intel Corp., and tristating its [systems] *system* bus control lines so that the DMA can apply the programmed row address to refresh a memory row. The refresh overhead in this machine, that is, the proportion of total processing time used for refresh, is approximately 7%.

Column 2, line 35 to column 3, line 4:

Referring to FIG. 1, this is a simplified block diagram of the addressing system of a microcomputer incorporating a memory refresh system embodying the present invention. A microprocessor 1, which may be an 80286 chip produced by Intel Corp. is shown with 24 address outputs A0 through A23, a hold acknowledge output HLDA, a clock input CLK and hold request input HRQ. The remaining 41 connections to the 80286 have been omitted from FIG. 1 as they form no part of the present invention. The address outputs and clock input are self-explanatory. The HRQ and HLDA connection control ownership of the 80286 local bus. An HRQ input allows another device to request control of the local bus. When the 80286 grants control, it floats its bus drivers to an OFF condition and activates the HLDA output, thus entering a bus hold acknowledge condition. The local bus will now remain granted to the requesting device until HRQ becomes inactive, which results in the 80286 deactivating the HLDA output and regaining control of the local bus. Both HRQ and HLDA are active high signals. Address signals A0 through [A16] *A15* from processor 1 are applied to an address unit 2 to address a dynamic random access memory system (DRAM) 3. The essential function of address unit 2 is to multiplex the 16 bit address inputs to provide, for each such input, two successive 8 bit outputs on its A0 through A7 output lines. The first of these outputs corresponds with the A0 through A7 inputs and is applied to the memory to provide a row address. The second corresponds with the A8 through A15 inputs to provide a column address. These addresses are interpreted by memory 3 as row and column addresses respectively in response to the successive [applicant] *application* of row address strobe (RAS) and column address strobe (CAS) signals to respective inputs to the memory.

Column 4, line 8 to column 5, line 28:

The HRQ signal is alternatively generated in response to an output from flip-flop 11. This flip-flop is driven by the Q output of a flip-flop 14. As mentioned above, the timer input provides a signal every 15μsecs. This input clocks the D input, which is permanently high, to the Q output of flip-flop 14. This output is directly connected to the D input of flip-flop 11 and is transferred to the Q output of this flip-flop on the first positive-going excursion of the 4 MHz clock input. It should be noted here that this 4 MHz signal is the inverse of the 4 MHz signal driving the DMA, thus insuring that the LHRQ input from the DMA can not coincide with the clocking of flip-flop 11. When the D input is clocked to the Q output, the $\bar{Q}$ output goes low, thereby generating an active high HRQ output through AND gate 10 and OR gate 13. The Q output from flip-flop 11, now high, is applied to the D input of a flip-flop 15 which, on the next positive-going excursion of the 8 MHz system clock, raises its Q output. This output, together with the HLDA input and the HRQ signal, now all high, gate an AND gate 16, which, in response thereto, provides a low —REFRESH signal, as shown in FIG. 3, on line 17. [this] *This* signal is inverted by an inverter 18 to provide a high refresh signal REFR, which, as has been explained with reference to FIG. 1, causes the generation of the memory $\overline{RAS}$ signals.

The —REFRESH signal on line 17 activates two circuits, a counter/register circuit 19 and a sequencer comprising AND gates 20 and 21 and a multiple flip-flop circuit 22. Counter/register circuit 19 may be of the type SN54CS590 produced by Texas Instruments Corp. [this] *This* device comprises an 8-bit binary counter feeding an 8-bit storage register. The storage register [bus] *has* parallel outputs QA through QH. Separate clock inputs RCK and CCK are provided for the register and counter respectively. When these are coupled together as shown the counter state is always one ahead of the register. A gate input $\bar{G}$ (active low) gates the register to the output terminals QA through QH to provide memory address outputs A0 through A7. Thus, for each —REFRESH signal on line 17 the counter is clocked by one and for each gating [signals] *signal* on line 23 an address output is provided. These address outputs are sequenced to provide counts from 0 through 255 and then revert back to 0 for the next sequence. The timing of these addresses is shown on the system address SA0-7 line of FIG. 3.

Multiple flip-flop circuit 22, prior to the generation of the —REFRESH signal, provides a low output at each of terminals Q1 through Q4, and, therefore, corresponding high outputs at terminals $\bar{Q}$1 through $\bar{Q}$3. The lower input to AND gate 20, fed from the Q3 output of circuit 22 is, therefore low. The —REFRESH input through line 17 therefore gates AND gate 20 to provide a high signal to input D1 of circuit 22. On the next downward transition of the 8 MHz clock, the high D1 input is transferred to the Q1 output, making [Q1] *Q1* go low. This output from [Q1] *Q1* gates counter/register 19 to provide the current count in the register to address lines A0 through A7 to provide the system address bits SA0 through SA7 as shown in FIG. 3. As Q1 is coupled to D2 in circuit 22, on the next downward transition of the 8 MHz clock, the Q1 high output is transferred to the Q2 output, and Q̄2 goes low. This Q̄2 output gates a driver 24 to generate a —memory read (—MEMR) signal as shown in FIG. 3. This signal controls read cycles of the memory and replaces a normal memory read control signal from a bus controller. Thus the row, defined by the address from counter/register 19, in each of the memory blocks is accessed and thereby refreshed.

Ignoring, for the moment, the IO channel ready (IOCHRDY) input to the FIG. 2 system, the Q2 signal in circuit 22 is coupled to the D3 input, so, on the next downward transition of the 8 MHz clock, Q3 goes high and Q̄3 goes low. The Q̄3 output is coupled directly to the D4 input, so, on the next clock downward transition Q4 goes low. This output clears latches 14 and 11 over line 25 to drop the HRQ output. [this] *This* drop disables AND gate 16, so the —REFRESH on line 17 goes high, as shown in FIG. 3. The Q3 output, when it goes high, disables gate 20, so that on the same clock cycle as above, Q1 goes low and Q̄1 goes high. Thus the —MEMR from Q̄1 goes back to its high state as shown in FIG. 3. Thereafter during the next two clock pulses, circuit 22 is reset to its initial state, and the FIG. 2 circuit waits for the next timer input to carry out a further refresh cycle using the incremented address in counter/register 19. Thus, in response to 256 timer input signals, the whole memory is refreshed.

Column 5, lines 51 to 63:

As has been mentioned above, the FIG. 2 circuit effects a refresh cycle in response to each pulse from timer 1, which pulses occur at [15μsec.] *15 μsec.* intervals. This timing is selected to ensure that each memory row is refreshed once every [4μsec. this] *4 msec*. This is a typical refresh time requirement for DRAM's. Assuming each refresh cycle takes the full 5 cycles of the 8 MHz clock due to the IOCHRDY signal, then the total refresh overhead for the FIG. 1 system is:

$$5 \times 256 \times 125.10^{-9}/4.10^{-3} \times 100 = 4\%$$

AS A RESULT OF REEXAMINATION IT HAS BEEN DETERMINED THAT:

The patentability of claims 1 to 10 is confirmed.

New claims 11, 12 and 13 are added and determined to be patentable.

*11. A refresh generator system according to claim 10, wherein said dynamic memory access unit is clocked at a DMA clock speed and wherein said sequencer is clocked at a speed higher than said DMA clock speed.*

*12. A refresh generator system according to claim 1, wherein said data processing system further includes a direct memory access unit clocked at a DMA clock speed and wherein said sequencer is clocked at a speed higher than said DMA clock speed.*

*13. A refresh generator system according to claim 1 in which said first logic means is responsive either to said periodic signal or to a request signal from a direct memory access unit to develop said hold request signal.*

* * * * *